United States Patent [19]
Scofield

[11] Patent Number: 6,154,368
[45] Date of Patent: Nov. 28, 2000

[54] DEVICE AND METHOD FOR DISSIPATING THERMAL ENERGY OF ELECTRONIC CIRCUIT COMPONENTS

[75] Inventor: William Harold Scofield, Lombard, Ill.

[73] Assignee: Lucent Technologies, Inc., Murray Hill, N.J.

[21] Appl. No.: 09/152,886

[22] Filed: Sep. 14, 1998

[51] Int. Cl.$^7$ .................................................. H05K 7/20
[52] U.S. Cl. ........................................... 361/719; 165/80.3
[58] Field of Search ............................. 454/184; 165/122, 165/80.3, 185; 174/15.1, 16.1; 257/713, 721; 361/690, 694, 695, 704, 705, 717–719; 39/830, 832

[56] References Cited

U.S. PATENT DOCUMENTS

| | | |
|---|---|---|
| 4,130,856 | 12/1978 | Crall . |
| 4,296,455 | 10/1981 | Leaycraft . |
| 4,417,295 | 11/1983 | Stuckert . |
| 4,672,509 | 6/1987 | Speraw . |
| 4,674,704 | 6/1987 | Altoz . |
| 5,428,503 | 6/1995 | Matsushima . |
| 5,630,469 | 5/1997 | Butterbaugh . |
| 5,876,278 | 3/1999 | Cheng . |

*Primary Examiner*—Gerald Tolin
*Attorney, Agent, or Firm*—Wildman, Harrold, Allen & Dixon

[57] ABSTRACT

A device for dissipating thermal energy generated by an electrical circuit component to an air stream having a body which defines a first opening for receiving the air stream, a channel opening which communicates with the first opening and receives the air stream, in which the channel opening is reduced in dimension at a position downstream from the first opening providing an accelerated movement of the air stream, and a second opening which communicates with and is positioned downstream from the channel opening for discharging the air stream from the body. The body is secured in a position relative to the electrical circuit component enabling the accelerated air stream to communicate with the thermal energy generated by the electrical circuit component.

32 Claims, 8 Drawing Sheets

DEVICE AND METHOD FOR DISSIPATING THERMAL ENERGY OF ELECTRONIC CIRCUIT COMPONENTS

BACKGROUND OF THE INVENTION

This invention pertains to a device and method for dissipating the thermal energy dissipated by electronic circuit components, and more particularly the thermal energy associated with integrated circuit components located on printed circuit boards.

The problems associated with the release of thermal energy or heat generated by electronic circuit components is well known. A study by the U.S. Air Force reports that excessive temperature and resulting thermal overstressing accounts for fifty five percent of electronics failures. For further information about this study, the reader is referred to the web page http://www.flotherm.com/Prod_Info/About_FLOTHERM/about_FLOTHERM.html#problem, the disclosure of which is hereby incorporated by reference.

Presently, electronic circuit components are installed on circuit boards and air is forced over the circuit elements to transfer the heat away from the component and circuit board. The movement of air is achieved by convection through the use of motorized fans. This mode of heat transfer is commonly referred to as forced air convection.

In addition, air movement heat transfer devices, such as heat sinks, are frequently used. A typical heat sink device 10 is shown in FIG. 1. The device 10 shown in FIG. 1 is attached to an electronic circuit component 20. Alternatively, the device 10 is connected directly to a circuit board (not shown). The device 10 typically includes heat transfer enhancing fins 30 that are added to increase the surface area of the device 10 the properties of the device 10. The device 10 is connected to the electronic circuit component 20 at an interface 40 and secured by adhesive or mechanical hold downs.

Some of the problems associated with existing with heat sink devices such as the device 10 shown in FIG. 1 are as follows:

a. The existing heat sink devices are generally expensive, especially when the device includes intricate brazed multiple thin fin construction to provide a large surface area for heat dissipation.

b. The existing heat sink devices require a connection to the electronic circuit component, as they are not integral. Typically, adhesive is used to connect the heat sink to the circuit component. Since the principle of operation of existing heat sinks relies on conductive transfer from the component to the heat sink device, the adhesive connection has inherent shortcomings, such as increasing the thermal resistance between the heat generating source and the exposed surface area of the heat sink fins.

c. Some circuit components, such as transformers and rheostats, are not easily connected to the heat sink devices. Alternatively, the heat sink devices are located on the circuit board apart from such circuit components. This arrangement is not ideal for heat dissipation.

d. The size of the heat sink devices is proportional to the heat dissipated from the associated component. When the size of the heat sink device is large relative to the associated electronic circuit component the ability to access the component and its leads or even nearby components are inaccessible for testing and other operations. Furthermore, large heat sinks corrupt the airflow to upstream components.

e. When the heat sink component can not be attached to the component due to size restrictions or the nature of the component, i.e. transformers and rheostats, locating the heat sink device alternatively at another location on the circuit board consumes valuable space on the circuit board. Increasingly, as technologies grow circuit board space is at a premium.

f. The most efficient materials used to construct existing heat sink devices are expensive, such as copper or other highly conductive materials. The materials also add undesirable weight to the circuit board.

g. A free air stream exists in the space above the circuit board. A number of factors determine the characteristics of the free air stream. In any event, existing heat sink devices frequently create an undesired obstruction to the free air stream aiding a degradation of the characteristics of the free air stream. For example, in addition to an obvious physical obstruction, the aerodynamic properties of the heat sink devices create eddies and vortices at the downwind side of the heat sink impeding the flow of the free air stream.

h. When the fins of the existing heat sink devices extend well into the free steam of air, the heat transfer rate of thermal energy dissipated by components downstream of the heat sink is greatly reduced.

i. Existing heat sink devices ideally require the largest contact surface interface to provide the most efficient heat transfer. This cannot be achieved when the component is an erasable programmable read only memory (EPROM) which does not permit a heat sink interface, due to the device design which enables reprogramming without replacing the device or other integrated circuit component that does not permit an efficient interface due to irregular surface area such as exposed electronic power modules.

j. Heat dissipating components ordinarily have heat gradient characteristics. That is a specific location of the component is the principle source of heat dissipation. Existing heat sink devices do not provide a design that takes full advantage of this fact and thus do not attain the associated design, space and economic benefits.

The present invention is directed to overcoming, or at least reducing the affects of, one or more of the problems set forth above.

SUMMARY OF THE INVENTION

A device and method is provided for dissipating thermal energy from electronic components generated by an electrical circuit component to a free air stream that includes a body having an opening at a front end for receiving the free air stream, a cavity for channeling and accelerating the movement of the free air stream as the thermal energy generated by the electrical circuit component is transferred to the free air stream, and an opening at a rear end for discharging the free air stream after the transfer of thermal energy. The body has a diminished cross section extending from the front end to the rear end and includes a hood having a curved surface extending downwardly to the rear end. The opening at the rear end is positioned up stream of an imbedded junction of the electrical circuit component, and the opening at the front end is selectively sized to capture a portion of the free air stream.

Another aspect of the invention includes a body having a hood including a planar surface extending from the outer opening toward the rear opening, an outwardly facing convex surface extending from the planar surface and extending toward the rear opening, and an outwardly facing concave surface extending from the convex surface and extending to the rear opening. The front opening is larger than the rear opening, and wherein the body has a hood extending from the front opening to the rear opening. A pair of opposed sides are included, each side having a top edge connected to a respective outer edge of the hood and extending from the front opening to the rear opening. Each opposed side has a lower edge and a flange extending outwardly from each lower edge connected to the electrical circuit component with adhesive.

In a further aspect of the invention, a resilient member is connected to the body and extending downwardly to captively engage the electrical circuit component. The resilient member includes a base connected to the hood and a pair of resilient legs extending downwardly and each leg having contact portions to captively engage the electrical circuit component.

In yet another aspect of the invention, the electrical circuit component is connected to a circuit board and the cavity is positioned over the electrical circuit component and the body is secured to the circuit board and the flanges are secured to the circuit board with adhesive, screws or rivets.

These and other features and advantages of the present invention will become apparent from the following detailed description, the accompanying drawings and the appended claims.

BRIEF DESCRIPTION OF THE DRAWINGS

FIG. 11 shows devices in accordance with the invention mounted and connected to circuit components on adjoining circuit boards with the free stream of air flowing there between;

DETAILED DESCRIPTION

Figure 1:
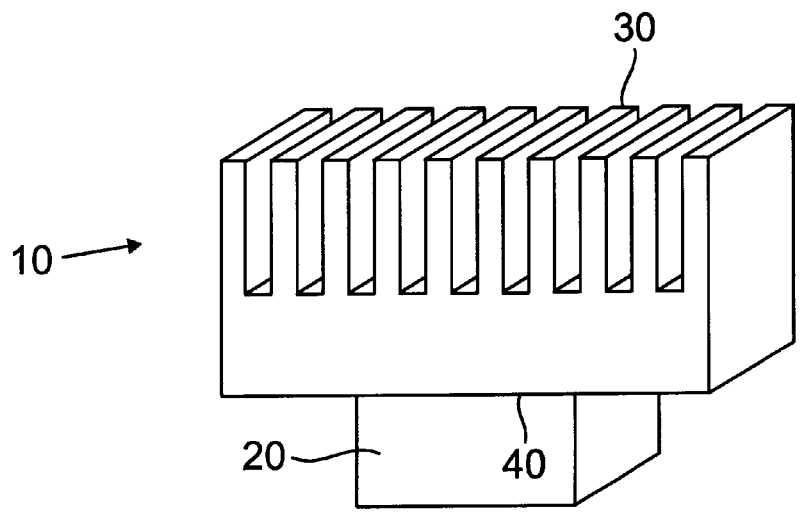
FIG. 1 shows a prior art device for dissipating thermal energy for electronic components in the prior art.
Figure 2:
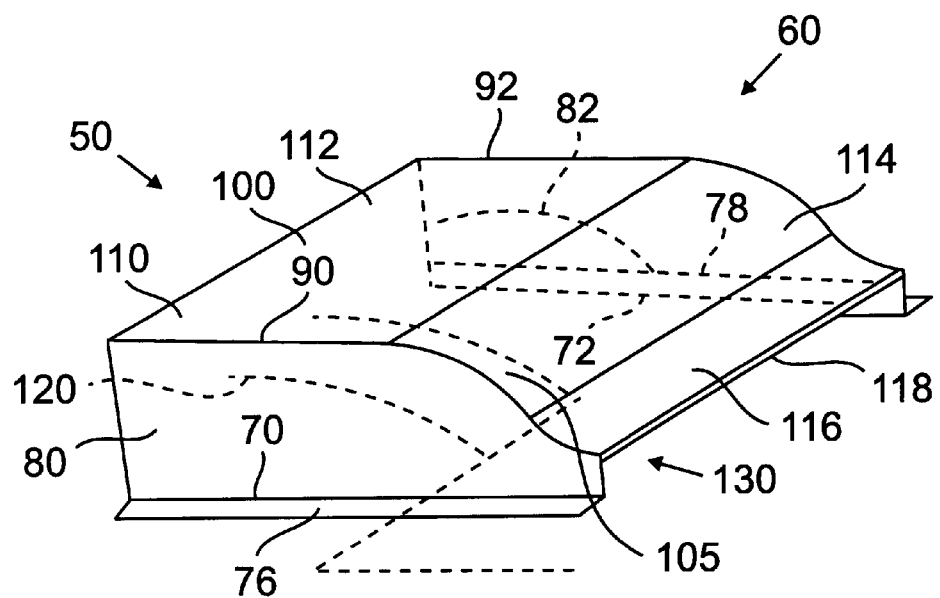
FIG. 2 shows a device in accordance with the invention.
Figure 3:
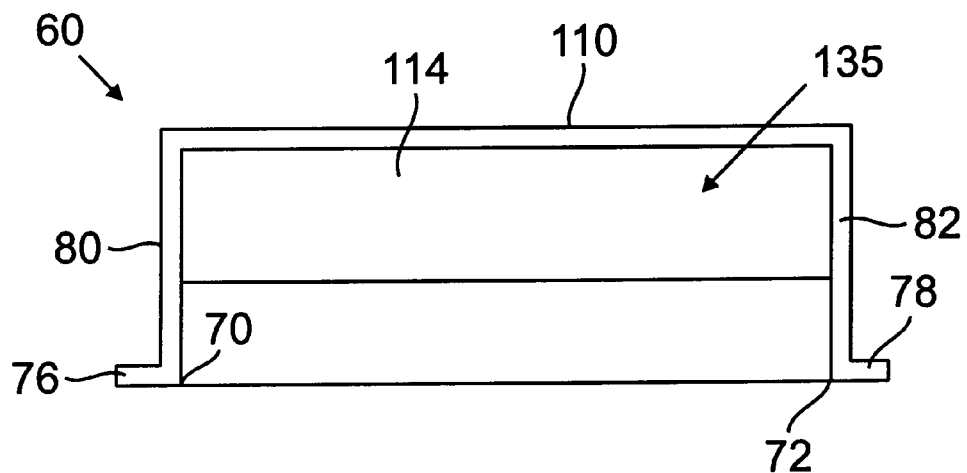
FIG. 3 shows a front view of the device show in FIG. 1.

Referring to FIGS. 2 and 3, a device 50 is shown in accordance with the invention. The device 50 having a housing in the shape of a scoop has at a lower side opposed edges 70 and 72. Each edge 70 and 72 has a respective flange 76 and 78 extending outwardly from the housing 60. A pair of opposed side walls 80 and 82 extend upwardly from respective opposed edges 72 and 74. The side walls 80 and 82 have upward edges 90 and 92, respectively connected to a hood 100.

The hood 100 has a generally flat portion 110 parallel to the edges 70 and 72. The flat portion 110 commences at a forward end 112 of the hood 100 and is connected to a downwardly extending portion 114 extending to and terminating at a rear end 118 of the hood 100. The downwardly extending portion 114 has a concave portion 115 facing downwardly and extending from the flat portion 110 and a convex portion 116 facing downwardly and extending from the concave portion 115 and terminating at the rear end 118 of the hood 100.

The forward end 112 of the hood 100 and forward ends of the side walls 80 and 82 define a forward opening 120, and the rear end of the hood 100 and the rear ends of the side walls 80 and 82 define a rear opening 130. The side walls 80 and 82 and hood 100 define a internal cavity or channel opening 135 of the device 50.

The device 50 in accordance with the invention is constructed of a firm material, such as plastic, metal or any natural and synthetic material capable of maintaining the shape of the device 50 as shown. Conductive materials are preferable because they contribute to the dissipation of thermal energy.

Figure 4:
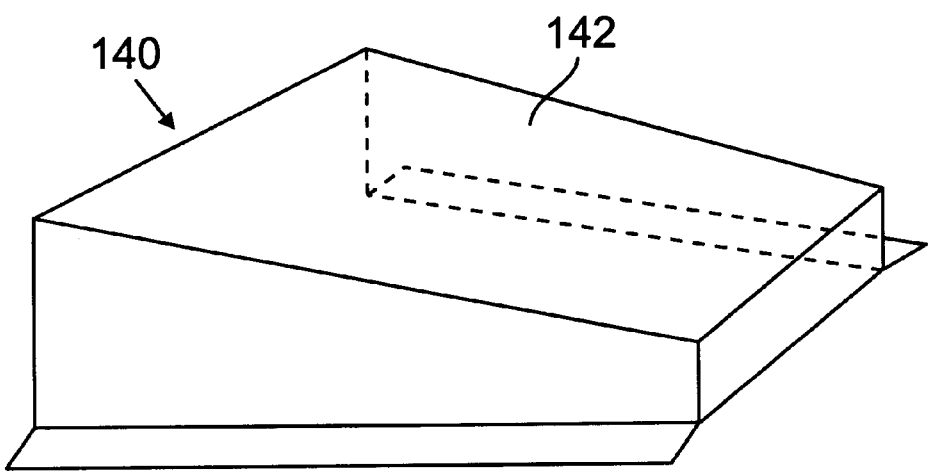
FIG. 4 another embodiment of a device in accordance with the invention.

FIG. 4 shows another embodiment of a device 140 in accordance with invention. The device 140 is show having a generally funnel shape and a flat hood 142. The invention is not limited to devices having an overall shape such as devices 50 and 140. Rather, the invention can be embodied in a variety polyhedron appearing forms. Alternatively, the shape of the hood of an embodiment of the invention can be concave or convex.

Figure 5:
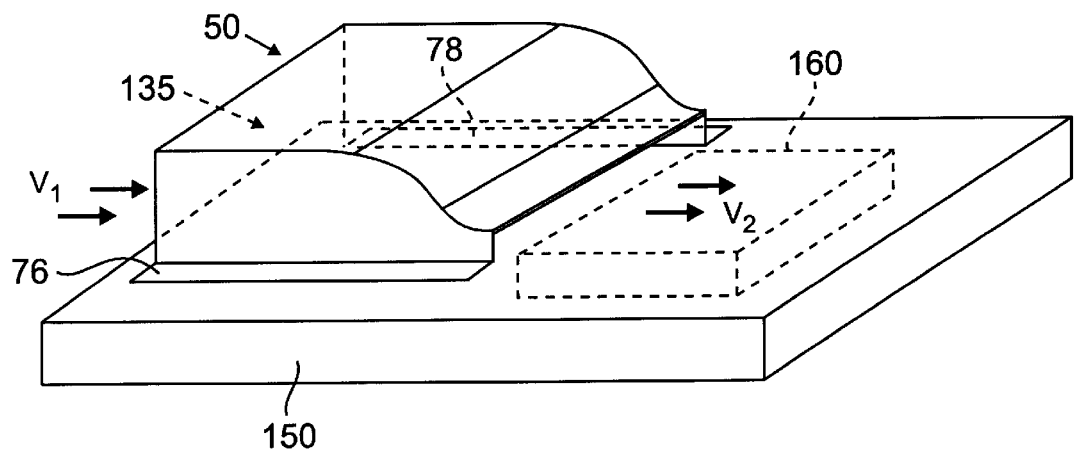
FIG. 5 shows the device in accordance with the invention mounted and connected to an integrated circuit (IC)

FIG. 5 shows the device 50 mounted and connected to an integrated circuit (IC) 150. Integrated circuit components usually have a temperature gradient with a relatively hot spot associated with an imbedded junction 160 typically located at the center of the device 50. Preferably, in accordance with the invention, the device 50 is mounted upstream of the embedded junction 160 with the embedded junction 160 at the rear opening 130 of the device 50 as shown in FIG. 5. As will be explained, this is preferable for the dissipation of thermal energy away from electronic circuit components such as the IC 150. The securement members or securement flanges 76 and 78 of the device 50 are connected to the IC 150 with adhesive or glue readily available on the market such as Thermagon Inc's T-gon 300 series adhesives. Alternatively, the device 50 can be connected to the IC 150 with mechanical hold downs or clamps.

As shown in FIG. 5, the device 50 in accordance with the invention receives input air at the forward opening 120 at a velocity VI the input air passes through the internal cavity 135. As the air proceeds through the internal cavity 135 of the device 50 the velocity of the air increases as passes through internal cavity 135 of the device 50 have a diminish cross sectional area. The air then exits at the rear opening 130 of the device 50 at an increased velocity V2 and passes over the imbedded junction 160 of the IC 150 where energy dissipated from the IC 150 is transferred to the air passing through the device 50.

Figure 6:
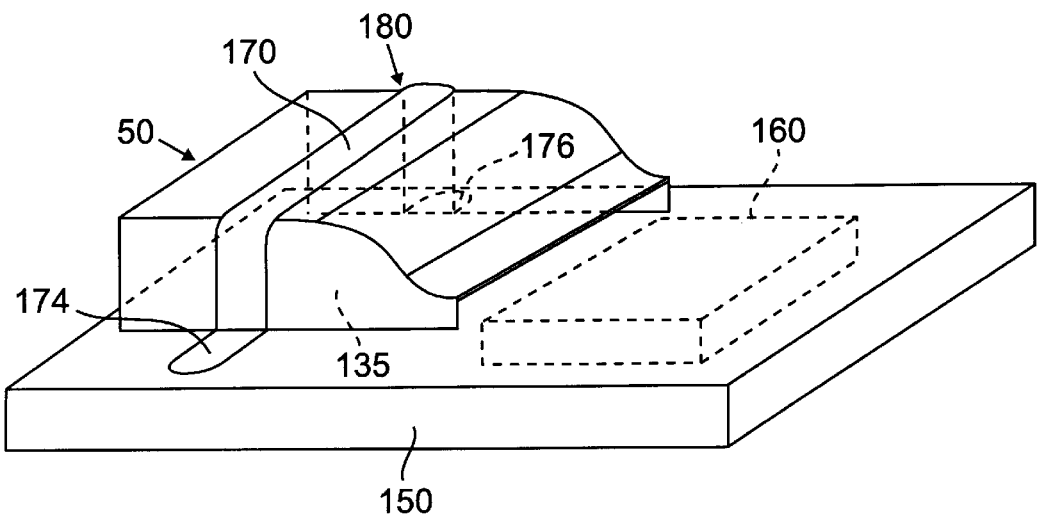
FIG. 6 shows the device in accordance with the invention and an alternate way of mounting and connecting the device to an integrated circuit (IC)

FIG. 6 shows another embodiment of connecting the device 50 to the IC 150. A clamp 170 connects the device 50 to the IC 150. The clamp 170 is attached to device 50 and opposed outer ends 174 and 176 are secured to the IC 150 by adhesive. The clamp 170 is sized so that pressure of the clamp 170 against the IC 150 holds the device 50 connected to the IC 150.

While the embedded junction 160 is shown downstream and adjacent to the rear opening 130, the embedded junction 160 is alternatively positioned within the cavity or channel opening 135.

Figure 7:
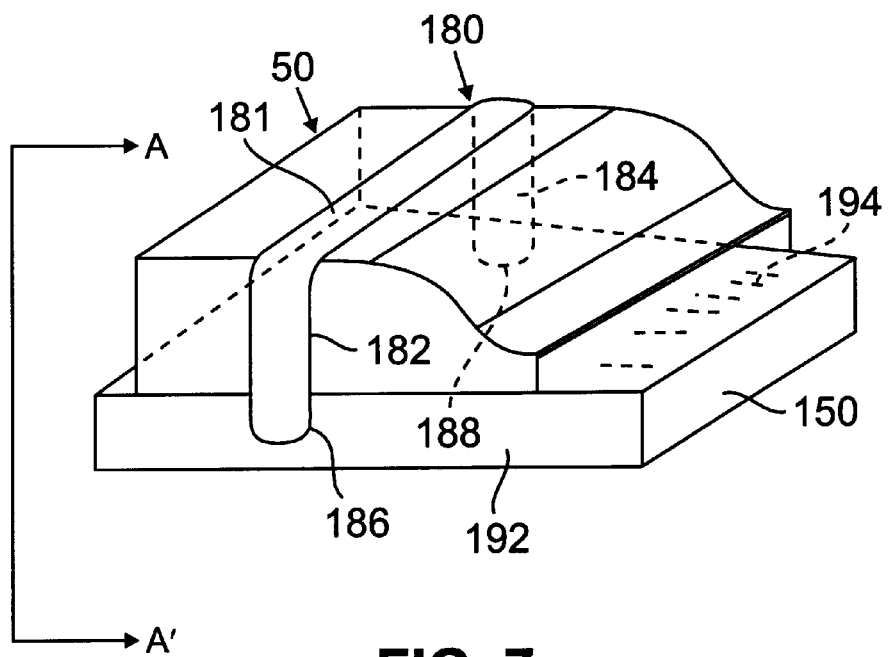
FIG. 7 shows the device in accordance with the invention and another alternate way of mounting and connecting the device to an integrated circuit (IC)
Figure 8:
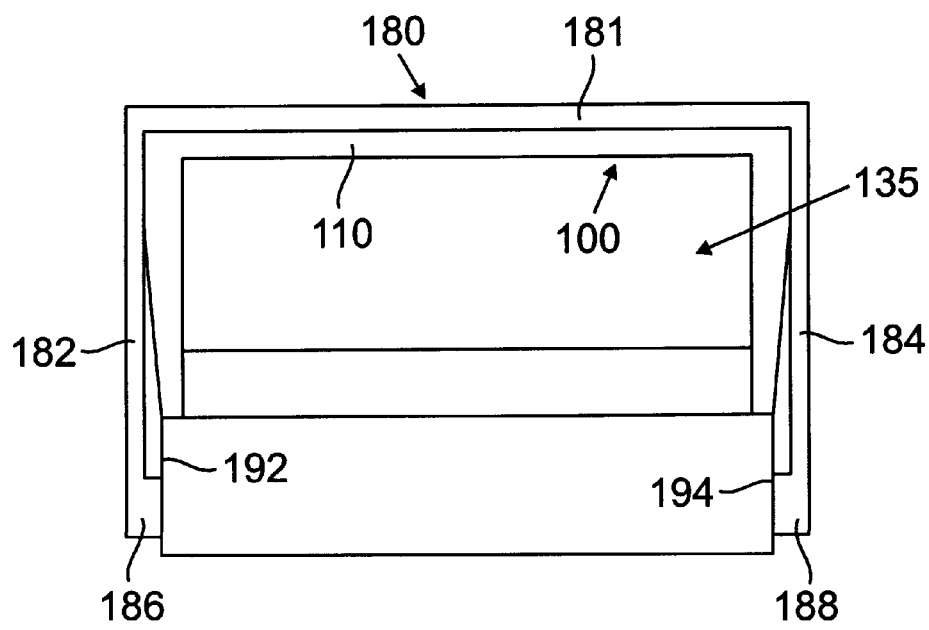
FIG. 8 shows a front view from A-A' of the device mounted and connected to an integrated circuit(IC) as shown in FIG. 7.

FIGS. 7 and 8 show another embodiment of connecting the device 50 to the IC 150. In this embodiment, the device 50 is sized so that it is nearly as wide as the IC 150. A clamp 180 having a base 181 and resilient legs 182 and 184 is preferably attached to the device 50 at the contact of the base 181 with the flat portion 110 of the hood 100. The resilient legs 182 and 184 have respective contact portions 186 and 188. The clamp 180 is sized so that the contact portions 186 and 188 grasp sides 192 and 194 of the IC 150 at contact points 192 and 194 to captively engage the IC 150 as shown in FIG. 8.

Figure 9:
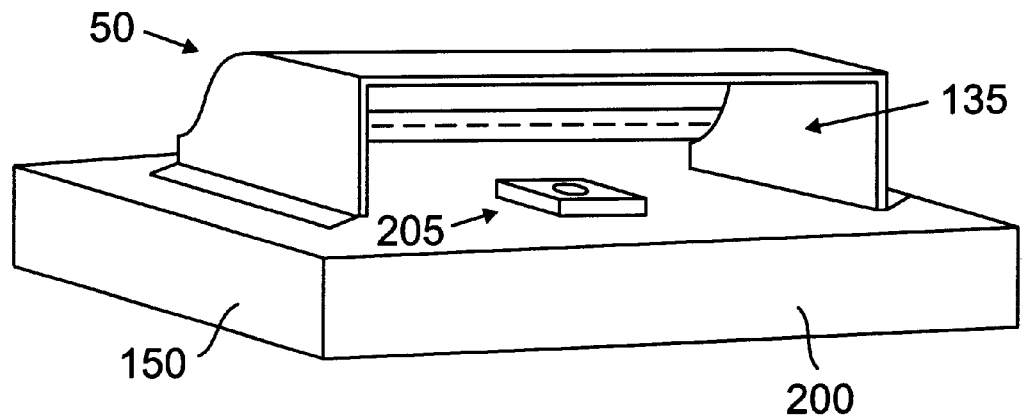
FIG. 9 shows the device in accordance with the invention mounted and connected to an EPROM.
Figure 10A:
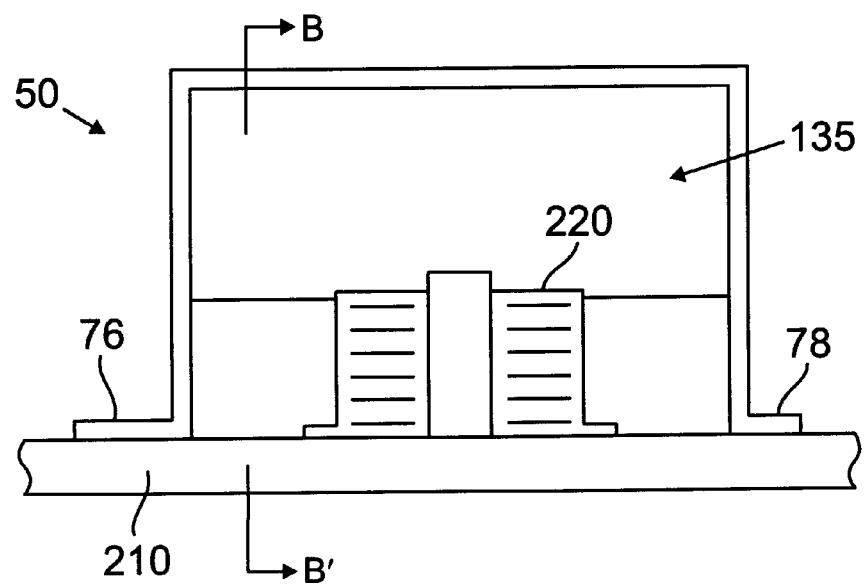
FIG. 10A shows the device in accordance with the invention mounted and connected to a circuit board and around a transformer.
Figure 10B:
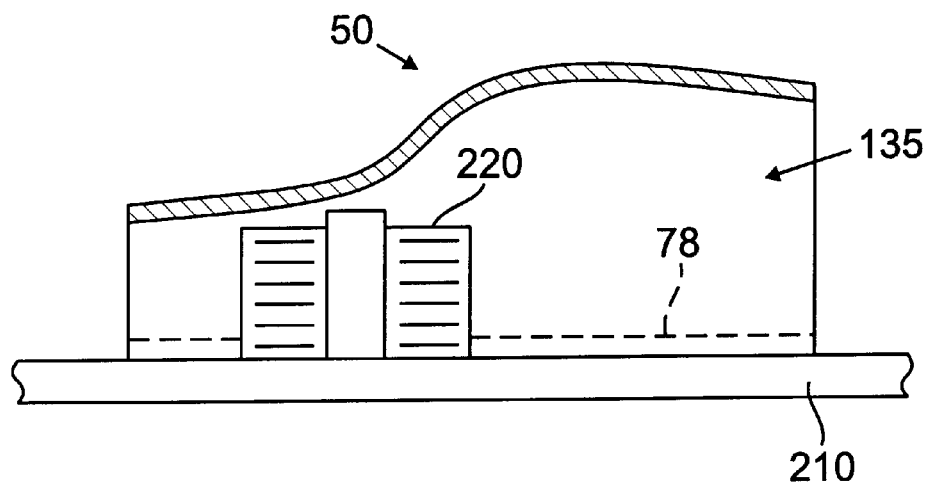
FIG. 10B shows a view of FIG. 10A along the section lines B-B'.

FIGS. 9 and 10A show yet other embodiments in accordance with the invention. In FIG. 9 the device is shown mounted and connected to an EPROM 200. The device 50 works with an electronic circuit component, EPROM 200, having an irregular surface 205 not suitable for attachment thereto. In FIG. 10A the device 50 is mounted and connected to a circuit board. Disposed within the interior of the device 50 is a power transformer 220. The device 50 in accordance with the invention works in combination with electronic circuit components having irregular surfaces that do not permit the device 50 to be directly mounted and connected as the IC 150 shown in FIG. 5. Other examples of circuit components that don't permit the device to be directly mounted are resistors, resistor networks, oscillators, and exposed power modules. FIG. 10B shows the device 50 and the IC 150 shown along the section lines B-B'. Preferably, the transformer 220 or other such circuit components are positioned near the rear opening 130 of the device 50. At this position the air velocity is the greatest and therefore yields the greatest heat transfer properties.

While the EPROM 200 and the power transformer 220 are shown positioned within the cavity or channel opening 135, it should be understood that alternatively they may be positioned downstream of the rear opening 130.

Figure 10C:
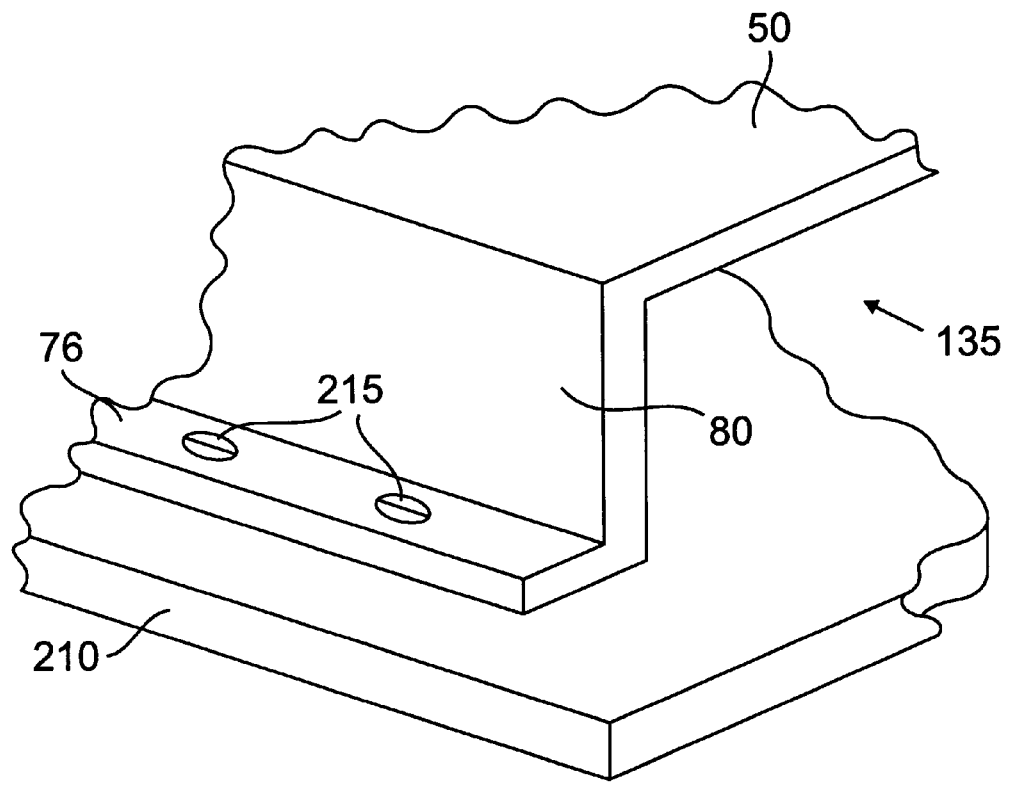
FIG. 10C shows a perspective view of a portion of the device and integrated circuit shown in FIG. 10A.

FIG. 10C shows an alternative way, in addition to adhesive, of connecting the device 50 to the circuit board 210. Screws 215 or fasteners including rivets, nuts and bolts and clamping devices are used to connect the device to the circuit board 210.

Figure 11:
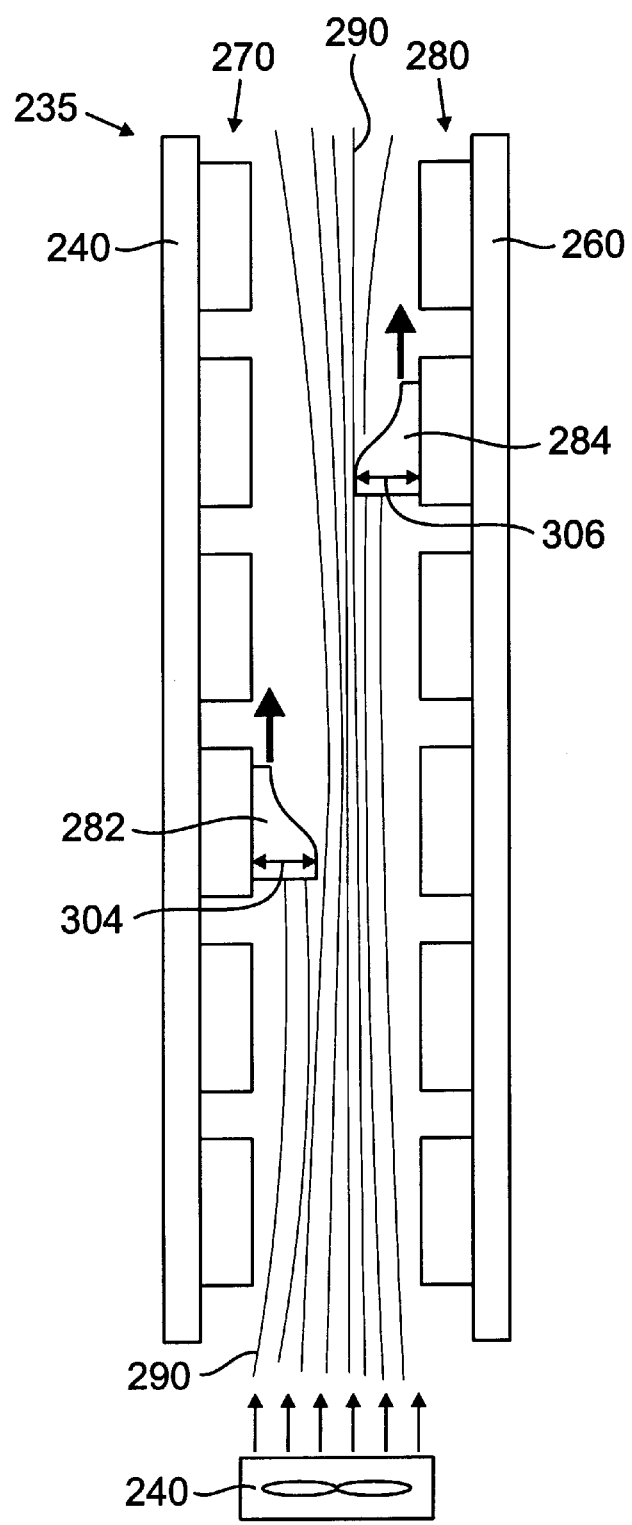

In FIG. 11, the operation of the invention is illustrated in a circuit board system 235. Opposed circuit boards 240 and 260 having a respective plurality of electronic circuit components 270 and 280. Devices 282 and 284 are shown connected to respective components 270 and 280. The number of components 270 and 280 having the devices 50 in accordance with the invention connected to them is a determination made as one of the design criteria when the circuit and hardware is designed A free air stream 290 exists in the system 235 by virtue of a convection effect and/or a power fan 300. As the free air stream moves upwardly from the source of the airflow, the stream narrows. This phenomenon is impacted by the nature of the electronic circuit components on the opposing sides of the circuit boards 240 and 260 and other factors impacting the flow of air. In accordance with the invention, the size including the height of the device 282 and 284 is selected so that it collects the desired input of air from the free air stream 290. For example, the height X 304 of the device 282 is different than the height Y 306 of the device 284 because the free air stream 290 generally narrows as it passes between the panels 240 and 260 because the free air stream 290 is narrower at the device 284 than it is at the device 282. Therefore, the height Y 306 of device 284 is greater than the height X 304 of the device 282.

Figure 12:
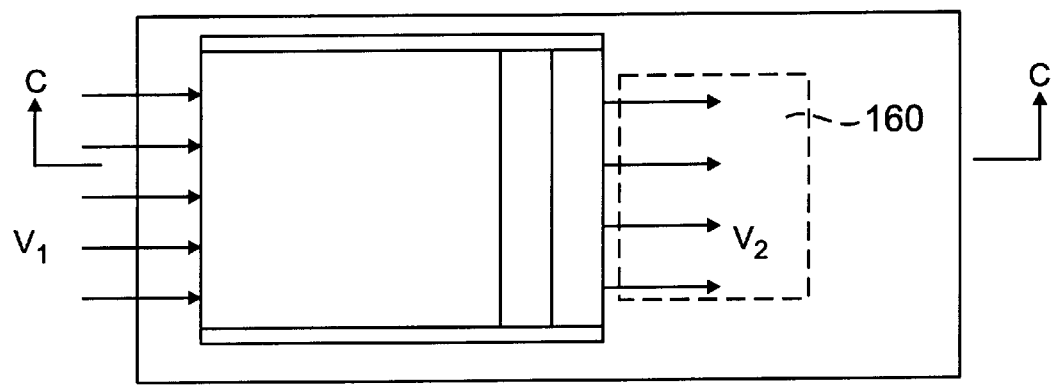
FIG. 12 shows a top view of FIG. 5.
Figure 13:
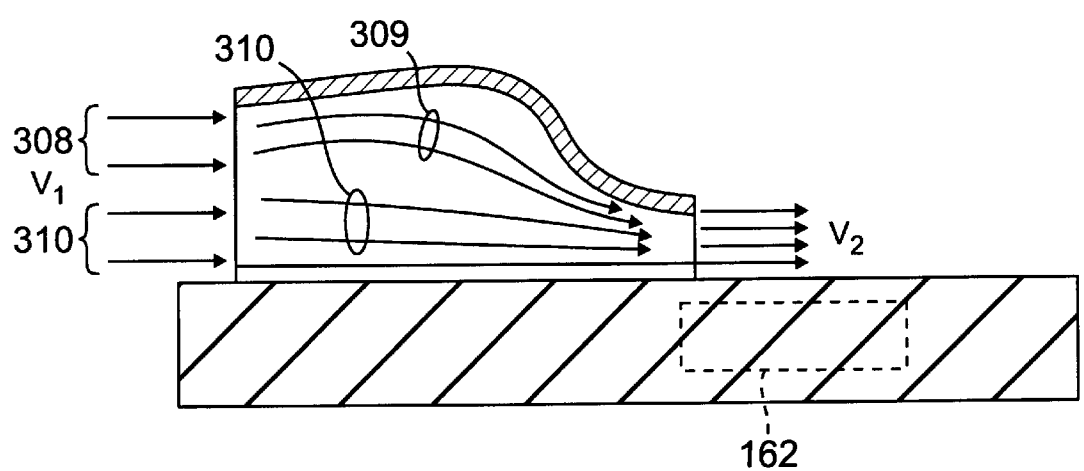
FIG. 13 shows a sectional view of FIG. 12 along the section lines C-C'.

FIGS. 12 and 13 illustrate the aerodynamic characteristics of the device 50. FIG. 12 is a top view of the device 50 and IC 150 as shown in FIG. 5. FIG. 13 is a sectional view of FIG. 12 along lines C-C' and shows the air flow characteristics of the device 50 in accordance with the invention and more particularly how thermal energy is dissipated from the electronic circuit component in this case, the IC 150.

Since the flow between the circuit packs or circuit board is always less than 100 m/sec~Mach =0.3 it can be modeled as incompressible in standard air. Also modeling the flow as steady state and one-dimensional will simplify the explanation of how the device in accordance with the invention works. This problem is illustrative of the Eulerian and Lagrangian methods of describing the motion of a particle. The acceleration of the moving particle in a velocity field is given by: $DV/Dt = u(\Box V/\Box x) + v(\Box V/\Box y) + w(\Box V/\Box z) + \Box V/\Box t$ and the flow field is given by: $v=w=0$, and $u=V_1(1+x/L)$ where x=channel length at L=x, L=channel length, $V_1$=velocity at the inlet of the converging channel, and V is the average velocity at point x. Therefore the acceleration at any point $a_{xp} = (V^2_1/L)e^{(V_1 t/L)}$. When $x_p = L = L[e^{(V_1 t/L)} - 1]$ at x=L then $a_{xp} = 2V^2_1/L$. The Bernoulli equation applies to incompressible air and the following basic equation results: $p_1/\Box + V^2_1/2 + gz_1 = p_2/\Box + V^2_2 + 2 + gz_2$. If the air density and elevation remains constant and the flow is at steady state, the flow is along a streamline, and the flow is uniform at inlet and outlet, which is a reasonable assumption for the design, then $V_1 A_1 = V_2 A_2$ where subscripts 1 and 2 represent the inlet and outlet respectively. Decreasing the cross-sectional area at the outlet by a factor of 2 would result in an increased exit velocity of two fold. The increased velocity enhances the heat transfer coefficient thereby resulting in an increased heat transfer rate.

Referring to FIG. 13, the air that is collected or scooped from the free air stream enters the forward end of the device 50 and the higher air 308 near the top of the device 50 has a relatively longer path 309 within the interior of the device 50 to travel from the forward end of the device 50 to the rear end of the device 50 as compared to the air 310 entering the device 50 and having a shorter path near the bottom of the device 50.

Those skilled in the art having the benefit of the present disclosure will appreciate that the present invention may take many forms and embodiments. Some embodiments have been presented and described so as to give an understanding of the invention. It is intended that these embodiments should be illustrative and not limiting of the present invention. Rather, it is intended that the invention cover all modifications, equivalents and alternatives falling within the spirit and scope of the invention as defined by the appended claims.

What is claimed is:

1. A device for dissipating thermal energy generated by an electrical circuit component to an air stream, comprising:

a body which defines, a forward opening for receiving the air stream, a channel member forming an opening which communicates with the forward opening and receives the air stream, in which the channel opening is reduced in dimension at a position downstream from the forward opening providing an accelerated movement of the air stream, wherein the channel member includes a concave portion connected to a convex portion a rear opening which communicates with and positioned downstream from the channel opening for discharging the air stream from the body; and means securing the body in a position relative to the electrical circuit component with the accelerated air stream communicating with the thermal energy generated by electrical circuit component.

2. The device of claim 1 in which the forward opening is of a larger dimension than the rear opening.

3. The device of claim 1 in which the body includes at least one curved sidewall in defining the channel opening.

4. The device of claim 1 in which the body includes at least one substantially straight sidewall in defining the channel opening.

5. The device of claim 1 in which the securing means includes an adhesive securing the body to the electrical circuit component in which the thermal energy generated by the electrical circuit component is positioned adjacent the channel opening.

6. The device of claim 1 in which the securing means includes an adhesive securing the body to a circuit board member in which the rear opening of the body is positioned upstream from the thermal energy generated by the circuit component.

7. The device of claim 1 in which the securing means includes an adhesive securing the body to a circuit board member in which the thermal energy generated by the circuit component is positioned within the channel opening.

8. The device of claim 1 in which the securing means includes a securement member positioned through a portion of the body and into a circuit board member securing the body to a circuit board member in which the rear opening of the body is positioned upstream from the thermal energy generated by the circuit component.

9. The device of claim 1 in which the securing means includes a securement member positioned through a portion of the body and into a circuit board member securing the body to a circuit board member in which the circuit component is positioned within the channel opening.

10. The device of claim 1 in which the securing means includes a resilient member connected to the body and captively engaging the electrical circuit component.

11. A device for dissipating thermal energy generated by an electrical circuit component to a free air stream, the device comprising:

a body having, an opening at a front end for receiving the free air stream, a cavity defined by a concave portion connected to a convex portion for channeling and accelerating the movement of the free air stream as the thermal energy generated by the electrical circuit component is transferred to the free air stream, and an opening at a rear end for discharging the free air stream after the transfer of thermal energy.

12. The device of claim 11 wherein the body has a diminished cross section extending from the front end to the rear end.

13. The device of claim 11 wherein the body includes a hood having a curved surface extending downwardly to the rear end.

14. The device of claim 11 wherein the opening at the rear end is positioned up stream of an imbedded junction of the electrical circuit component.

15. The device of claim 11 wherein the opening at the front end is selectively sized to capture a portion of the free air stream.

16. The device of claim 11 wherein the body has a hood including a planar surface extending from the outer opening toward the rear opening, an outwardly facing convex surface extending from the planar surface and extending toward the rear opening, and an outwardly facing concave surface extending from the convex surface and extending to the rear opening.

17. The device of claim 11 wherein the front opening is larger than the rear opening, and wherein the body has a hood extending from the front opening to the rear opening.

18. The device of claim 17 including a pair of opposed sides, each side having a top edge connected to a respective outer edge of the hood and extending from the front opening to the rear opening.

19. The device of claim 18 wherein each opposed side has lower edge and a flange extending outwardly from each lower edge.

20. The device of claim 19 wherein the flanges are connected to the electrical circuit component.

21. The device of claim 20 wherein the flanges are connected to the electrical circuit component with adhesive.

22. The device of claim 11 includes a resilient member connected to the body and extending downwardly to captively engage the electrical circuit component.

23. The device of claim 22 wherein the resilient member includes a base connected to the hood and a pair of resilient legs extending downwardly and each leg having contact portions to captively engage the electrical circuit component.

24. The device of claim 21 wherein the electrical circuit component is connected to a circuit board and the cavity is positioned over the electrical circuit component and the body is secured to the circuit board.

25. The device of claim 24 wherein the flanges are secured to the circuit board.

26. The device of claim 25 wherein the flanges are secured to the circuit board with at least one of (a) adhesive, (b) screws, and (c) rivets.

27. A method for dissipating thermal energy generated by an electrical circuit component to a free air stream, the method comprising the steps of:

collecting a portion of the free air stream;

passing the collected free air stream portion over the electrical circuit component to transfer the thermal energy to the collected free air stream portion;

accelerating the movement of the collected air stream portion through a cavity having a concave portion connected to a convex portion; and after transferring the thermal energy, discharging the collected free air stream portion away from the electrical circuit component.

28. The method of claim 27 including the step of channeling the collected free air portion through a scoop shaped body.

29. The method of claim 27 wherein the method further comprises the steps of receiving the collected free air portion at a front opening of the body, and discharging at a rear opening of the body the collected free stream air portion after the transfer of the thermal energy.

30. A system for dissipating thermal energy generated by an electrical circuit component to a free air stream, the system comprising of:

means for collecting a portion of the free air stream;

means for passing the collected free air stream portion over the electrical circuit component to transfer the thermal energy to the collected free air stream portion;

means for accelerating the movement of the collected air stream portion through a cavity having a concave portion connected to a convex portion; and means for transferring the thermal energy, discharging the collected free air stream portion away from the electrical circuit component.

31. The system of claim 30 including the means for channeling the collected free air portion through a scoop shaped body.

32. The system of claim 31 wherein the body includes a front opening for receiving the collected free air portion, and discharging at a rear opening the collected free stream air portion after the transfer of the thermal energy.

* * * * *